(12) United States Patent
Frey et al.

(10) Patent No.: US 11,465,177 B2
(45) Date of Patent: Oct. 11, 2022

(54) PMUT ULTRASOUND TRANSDUCER WITH DAMPING LAYER

(71) Applicant: FUJIFILM SonoSite, Inc., Bothell, WA (US)

(72) Inventors: Gregg Frey, Issaquah, WA (US); Wei Li, Bothell, WA (US)

(73) Assignee: FUJIFILM SONOSITE, INC., Bothell, WA (US)

( * ) Notice: Subject to any disclaimer, the term of this patent is extended or adjusted under 35 U.S.C. 154(b) by 565 days.

(21) Appl. No.: 16/413,999

(22) Filed: May 16, 2019

(65) Prior Publication Data

US 2019/0351453 A1 Nov. 21, 2019

Related U.S. Application Data

(60) Provisional application No. 62/674,356, filed on May 21, 2018.

(51) Int. Cl.
  *B06B 1/06* (2006.01)
  *H01L 41/047* (2006.01)
  *H01L 41/09* (2006.01)

(52) U.S. Cl.
  CPC ........ *B06B 1/0685* (2013.01); *H01L 41/0472* (2013.01); *H01L 41/0973* (2013.01); *B06B 2201/55* (2013.01)

(58) Field of Classification Search
  CPC ............... H01L 41/093; H01L 41/0472; B06B 2201/55; B06B 1/0685
  See application file for complete search history.

(56) References Cited

U.S. PATENT DOCUMENTS

| | | | |
|---|---|---|---|
| 6,659,954 B2 | 12/2003 | Robinson | |
| 8,193,685 B2 | 6/2012 | Klee | |
| 9,307,952 B2 | 4/2016 | Van Hoven et al. | |
| 9,437,802 B2 | 9/2016 | Li | |
| 2003/0114760 A1* | 6/2003 | Robinson | B06B 1/0692 600/459 |

(Continued)

FOREIGN PATENT DOCUMENTS

| | | |
|---|---|---|
| JP | 2005168807 A | 6/2005 |
| JP | 2008178589 A | 8/2008 |

(Continued)

OTHER PUBLICATIONS

International Search Report and Written Opinion for Application No. PCT?US2019/033004, dated Sep. 5, 2019, 11 pages.

(Continued)

*Primary Examiner* — J. San Martin
(74) *Attorney, Agent, or Firm* — Womble Bond Dickinson (US) LLP

(57) ABSTRACT

A PMUT ultrasound transducer includes a number of PMUT transmitting elements in a membrane layer. Behind each PMUT transmitting element is a cavity in the membrane layer. The cavities are partially or completely filled with a damping material to reduce ringing of the PMUT transmitting elements. Suitable damping materials include polymers, e.g., soft epoxies, benzocyclobutene or polyimide that are dispersed into the cavities or a phase changing material such as Parylene that precipitates out of a gas phase as a polymer when cured.

15 Claims, 8 Drawing Sheets

(56) References Cited

U.S. PATENT DOCUMENTS

| | | |
|---|---|---|
| 2005/0242689 A1* | 11/2005 | Tahara ............... B06B 1/0629 |
| | | 310/334 |
| 2006/0238067 A1 | 10/2006 | Dausch |
| 2014/0148703 A1 | 5/2014 | Deladi et al. |
| 2014/0219063 A1 | 8/2014 | Hajati et al. |
| 2014/0276087 A1 | 9/2014 | Corl |
| 2016/0059012 A1 | 3/2016 | Adamson et al. |

FOREIGN PATENT DOCUMENTS

| | | | |
|---|---|---|---|
| JP | 2009125274 A | 6/2009 | |
| JP | 2010264175 A | 11/2010 | |
| JP | 2011104137 A | 6/2011 | |

OTHER PUBLICATIONS

Japanese Office Action and Search Report on the Patentability of Application No. 2019-524127, dated Dec. 3, 2020, 5 pages.
Extended European Search report on the Patentability of Application No. PCT/US2019033004 dated Jan. 28, 2022, 15 pages.

* cited by examiner

PMUT ULTRASOUND TRANSDUCER WITH DAMPING LAYER

This application claims the benefit of priority to U.S. Provisional Patent Application No. 62/674,356, filed May 21, 2018, which is hereby incorporated by reference in its entirety.

TECHNICAL FIELD

The disclosed technology relates to ultrasound transducers and to PMUT ultrasound transducers in particular.

BACKGROUND

Piezoelectric Micromachined Ultrasonic Transducers (PMUT) are MEMS-based piezoelectric ultrasonic transducers that can be made with semiconductor processing techniques. Unlike conventional ultrasound transducers that use a bulk piece of a piezoelectric ceramic such as PZT or single-crystal PMN-PT to generate ultrasound signals, PMUT transducers are based on the flexural motion of a thin membrane. Despite the fact that PMUTs can be manufactured in high volumes using wafers, they do not perform as well as conventional transducers designs in several categories. PMUT transducers tend to be very "ringy" compared to conventional transducers. Due to the ringing of the transmitting elements, they are generally responsive to a narrow range of frequencies, which limits the ability of a transducer to detect echo signals at significant frequencies above and below the frequency at which they are driven.

SUMMARY OF THE DESCRIPTION

To address this problem, the disclosed technology relates to a PMUT ultrasound transducer that includes an amount of damping material positioned in the cavities formed behind each of the transmitting elements. A PMUT transducer has a number of transmitting/receiving elements, each of which is formed with a cavity on a rear surface of a membrane layer. The cavities behind the transmitting/receiving elements are at least partially filled with a material that damps the ringing of the transmitting/receiving elements as they are excited with a driving pulse. In some embodiments, the damping material is a polymeric material. In some embodiments, the damping material is applied by spin coating a wafer to disperse the material in the cavities. In other embodiments, the damping material is applied in a gas phase that condenses onto the walls and surfaces of the cavities when cured.

The above summary does not include an exhaustive list of all embodiments in this disclosure. All systems and methods can be practiced from all suitable combinations of the various aspects and embodiments summarized above, and also those disclosed in the Detailed Description below.

BRIEF DESCRIPTION OF THE DRAWINGS

The appended drawings illustrate examples and are, therefore, exemplary embodiments and not considered to be limiting in scope.

DETAILED DESCRIPTION

Various embodiments and aspects will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment. The appearances of the phrase "in one embodiment" in various places in the specification do not necessarily all refer to the same embodiment. Furthermore, the particular features, structures, or characteristics may be combined in any suitable manner in one or more embodiments. Although the processes are described below in terms of some sequential operations, it should be appreciated that some of the operations described may be performed in a different order. Moreover, some operations may be performed in parallel rather than sequentially.

As indicated above, one of the problems with PMUT transducers is the fact that transducer elements tend to ring when driven with an excitation pulse. This ringing limits the bandwidth of the echo signals that can be detected to a frequency range that is near the frequency of the excitation pulses. As a result, PMUT ultrasound transducers are much less sensitive to higher or lower frequency signals than the operating center frequency than can be detected with conventional transducer designs. The technology disclosed herein relates to a system for decreasing the ringing of the transducer elements by partially or completely filling a rear cavity of PMUT transmitting/receiving elements with a damping material. As will be described, a damping material can be a polymeric material that is applied by spin coating the material into the PMUT cavities before a substrate layer is bonded to a membrane layer or by drawing a non-viscous damping material into the cavities with vacuum. In another embodiment, the cavities are infiltrated with a gaseous material that precipitates into a damping layer within the cavities when cured.

Figure 1:
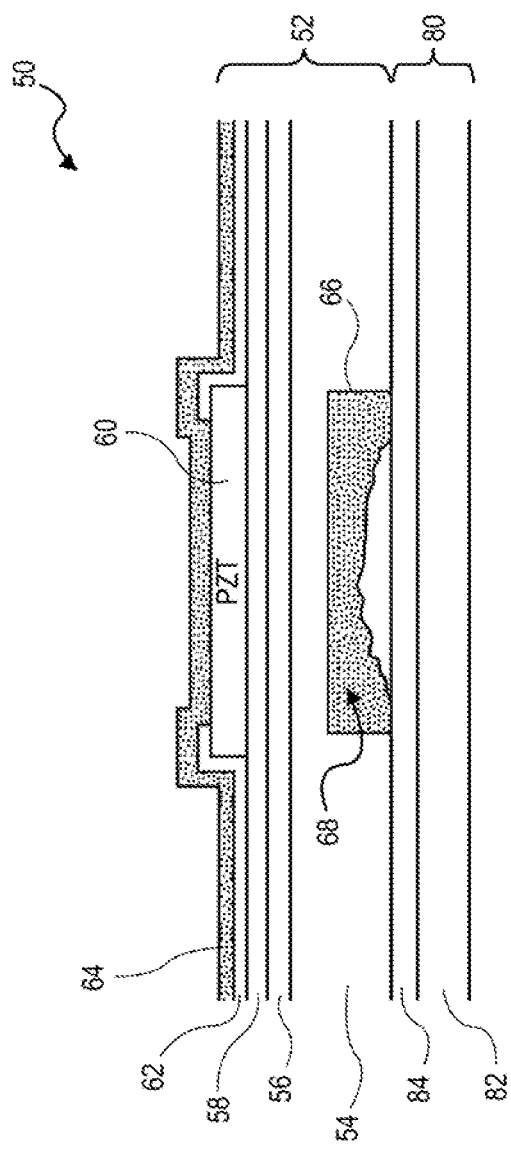
FIG. 1 is a cross-sectional view of a single PMUT ultrasound transmitting/receiving element constructed in accordance with an embodiment of the disclosed technology.

FIG. 1 shows a cross-section of a PMUT transducer constructed in accordance with an embodiment of the disclosed technology. In one embodiment, the PMUT transducer 50 comprises a membrane layer 52 and a substrate layer 80 that are bonded together. The membrane layer 52 as shown includes single PMUT transmitting/receiving element (for simplicity referred to hereinafter as a PMUT transmitting element) that positioned on the membrane layer 52. In the embodiment shown, the membrane layer 52 is formed from a silicon substrate 54 with a layer of silicon oxide 56 that covers the substrate 54. A first electrode 58 over the silicon oxide layer 56 is used to provide the driving signals to one side of a PMUT transmitting element 60 that is made from a piezoelectric material such as PVDF. An insulator layer 62 is positioned over the electrode 56 and a portion of the transmitting element 60. A second electrode layer 64 is positioned over the insulator layer 62. Typically, the second electrode layer 64 acts as a common ground for a number of PMUT transmitting elements (not shown). However, the connections to the electrode layers 58 and 64 could be reversed.

The rear surface of the silicon substrate 54 of the membrane layer 52 has a cavity 66 that is positioned behind the transmitting element 60. The cavity 66 allows the transmitting element 60 to flex the silicon substrate 54 when the transmitting element is driven with a transmitting signal and upon receipt of acoustic signals. In accordance with aspects of the disclosed technology, the cavity 66 is partially or completely filled with a damping material 68 that damps the ringing of the PMUT transmitting element 60 when driven with a driving signal or when it receives an acoustic echo signal. As will be discussed below, the amount of damping is dependent on the desired characteristics of the transducer. Too much damping and the transducer will not be responsive to received ultrasound energy; too little damping and bandwidth of the transducer is limited to frequencies near those of the driving signals. In one embodiment, the amount of the damping material in the cavity is determined based on a desired ringing attenuation of the PMUT element, a desired sensing frequency bandwidth of the echo signals received by the PMUT element, or a combination thereof.

In the embodiment shown, a substrate layer 80 that is bonded to the back surface of the membrane layer 52 comprises a silicon layer 82 and a layer of silicon oxide 84 that is over the silicon layer 82. In one embodiment, the membrane layer 52 and substrate layer 80 are bonded together so that the cavity 66 behind the PMUT transmitting element 60 is sealed by the substrate layer 80.

In some embodiments, the substrate layer 80 may include holes, perforations or other structures (not shown) that port the cavity 66 to change its frequency characteristics in a similar manner as a port on an acoustic speaker. In some embodiments, the substrate layer 80 may be omitted entirely.

As will be appreciated by those having ordinary skill in the art, the structure of the PMUT transducer may vary with different manufacturing methods. The disclosed technology is directed to techniques of damping the PMUT transmitting elements by partially or completely filling the cavities 66 behind the transmitting elements with a damping material.

Figure 2A:
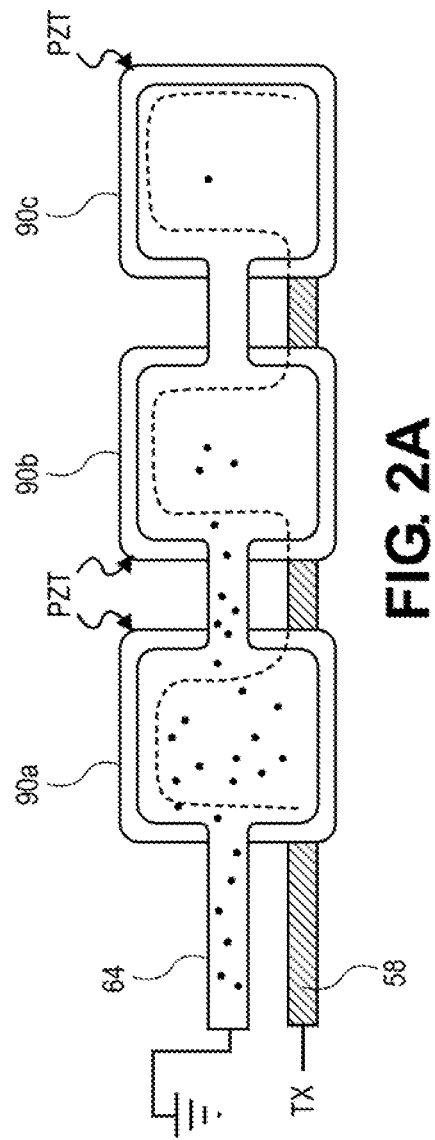
FIG. 2A is a top plan view of a number of PMUT transducer transmitting/receiving elements connected in parallel according to one embodiment.

FIG. 2A is a top plan view of a number of PMUT transmitting elements connected in parallel. In the example shown, a row of PMUT transmitting elements 90*a*, 90*b*, 90*c* are positioned side by side on a substrate. The elements are supplied with driving signals by a common electrode 58 on their bottom surface and share a common ground electrode 64 on their top surface. In some embodiments, each PMUT transmitting element 90 may have its own electrode to deliver a driving signal. However, in most embodiments, the total acoustic power that can be produced by any single PMUT transmitting element is small compared with a conventional ultrasound sound transducer. Therefore, PMUT elements are usually driven in parallel to increase the total acoustic power on the transmit side and acoustic signals are received and processed in parallel to increase the receive signal power.

Figure 2B:
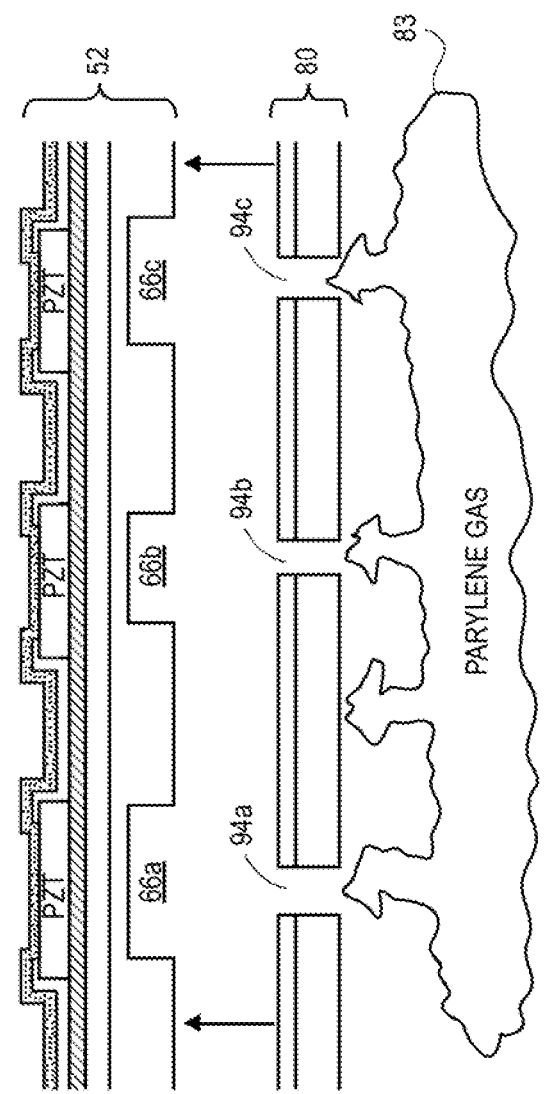
FIG. 2B is a cross-sectional view illustrating a damping material supplied to a rear cavity of the transducer elements in accordance with an embodiment of the disclosed technology.

FIG. 2B is a cross-sectional view illustrating a damping material supplied to a rear cavity of the transducer elements in accordance with an embodiment of the disclosed technology. As shown in FIG. 2B and indicated above, in some embodiments, the substrate layer 80 is bonded to the membrane layer 52 to seal cavities 66*a*, 66*b* and 66*c* behind each of the transmitting elements 90*a*, 90*b*, 90*c* respectively. In some embodiments, a damping material 83 is added to the cavities before the substrate layer 80 is bonded to the membrane layer 62. In other embodiments, ports 94*a*, 94*b*, 94*c* etc. in the substrate layer 80 align with the cavities. A damping material can pass through the ports 94*a*, 94*b*, 94*c* to fill the cavities after the substrate layer 80 is bonded to the membrane layer 52. In some embodiments, a material such as Parylene vapor deposited poly (p-xylyene) that is a polymeric material that can be delivered through the ports 94*a*, 94*b*, 94*c* in a gas phase and that condenses out to form a polymeric damping layer in the cavities 66*a*, 66*b* and 66*c*.

Figure 3:
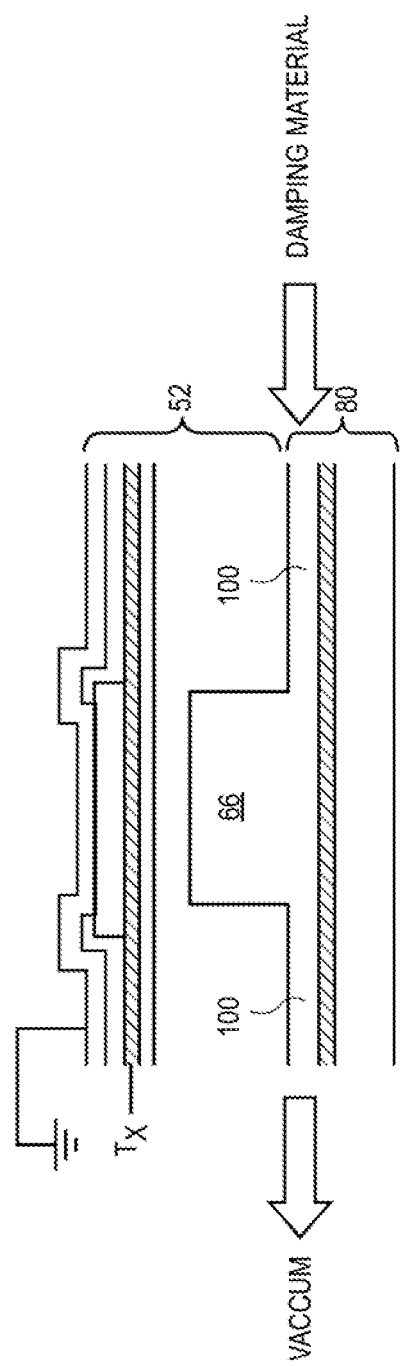
FIG. 3 is a cross-sectional view of a single PMUT transducer transmitting/receiving element with a cavity that is connected to a manifold through which a damping material can be supplied in accordance an embodiment of the disclosed technology.

FIG. 3 shows yet another embodiment of a PMUT transducer in accordance with the disclosed technology. In this embodiment, each cavity in the membrane layer 52 is fluidly coupled to an input and an output channel 100 that connects the cavity to an edge of a wafer on which the PMUTS are manufactured. The channels 100, which can be formed as manifolds in the silicon substrate of the membrane layer or the substrate layer to allow a vacuum to be applied to the cavities behind the PMUT transmitting elements and a non-viscous damping material to be drawn into the cavities through the manifold channels. The damping material needs to be sufficiently non-viscous so that it can flow through the channels 100 into the cavities 66 in a non-cured state and then cure into a damping layer. Suitable materials include thinned epoxies, polymers, benzocyclobutene (BCP) or polyimides. Alternatively, a gaseous polymer can be drawn through the channels 100 such as Parylene as described above.

As indicated above, the acoustic power available from any single PMUT transmitting element is not generally sufficient to insonify tissue and generate a useful electronic signal of sufficient power that can be detected with the same single element. Therefore, multiple PMUT transmitting elements are often combined and driven in parallel in a PMUT ultrasound transducer.

Figure 4:
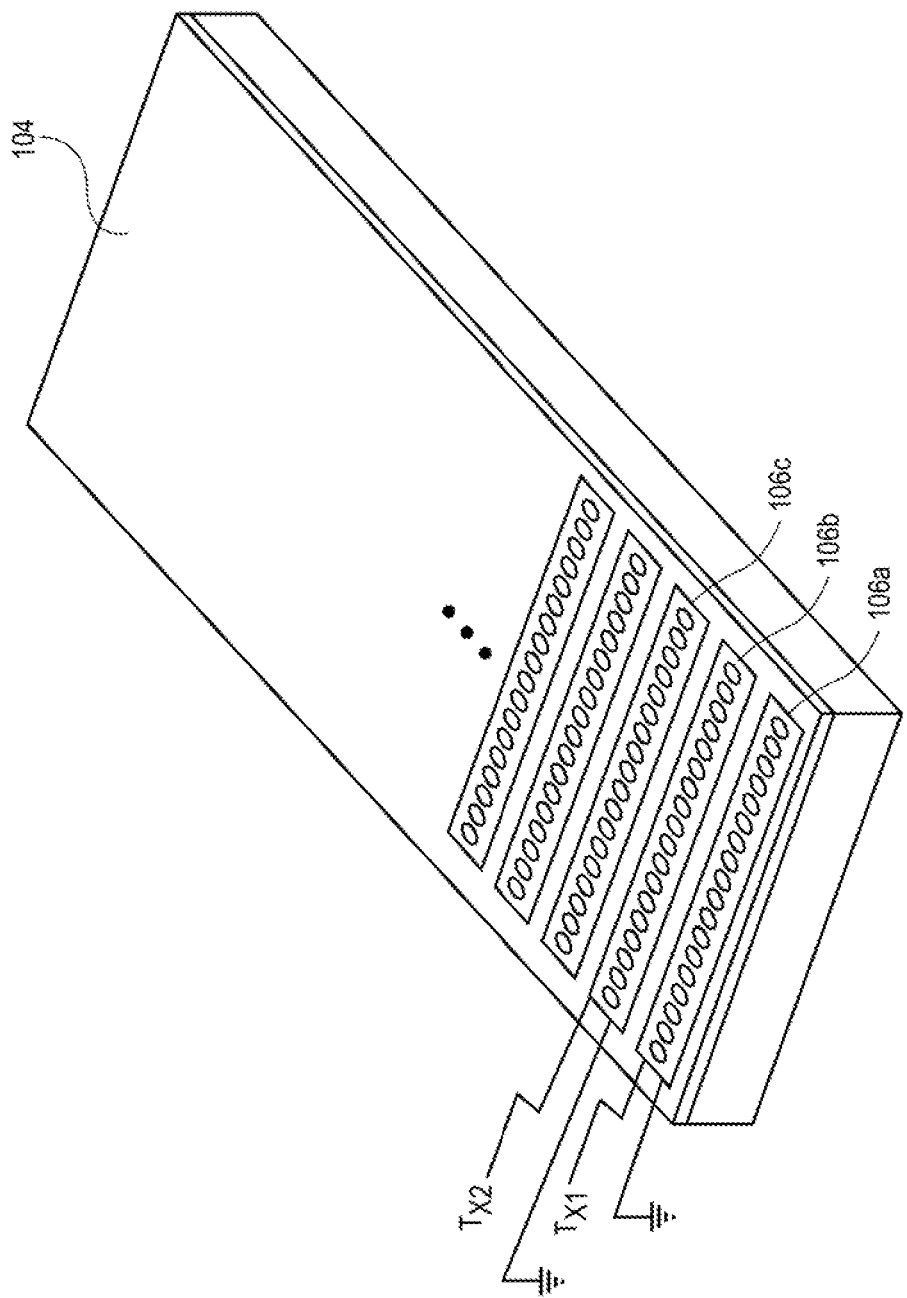
FIG. 4 illustrates an ultrasound transducer array having a number of elements each of which includes multiple PMUT transmitting/receiving elements in accordance with an embodiment of the disclosed technology.

FIG. 4 shows one embodiment of a transducer 104 having an array of spaced elements 106a, 106b, 106c, each of which includes a number of individual PMUT transmitting elements that are operated in parallel. Together, the PMUT transmitting elements of each array element 106 generate acoustic signals of sufficient power to insonify tissue of a subject under examination or other object being examined with ultrasound. In one embodiment, the signals produced by the PMUT transmitting elements of a single array element are processed in parallel upon receipt of an echo signal. In some embodiments, the individual array elements 106 of the transducer can controlled separately so that beam steering can be performed in order to transmit and receive signals from areas outside of the area directly in front of the transducer 104. In some embodiments, a majority or all of the PMUT transmitting elements have a cavity that is partially or fully filled with a damping material so that the ringing of the PMUT transmitting elements of the transducer is reduced. Because the PMUT transducer elements can be manufactured using semiconductor processing techniques, numerous transducer configurations are possible including linear arrays, phased arrays, 1.5 and 2 dimensional arrays etc.

Figure 5:
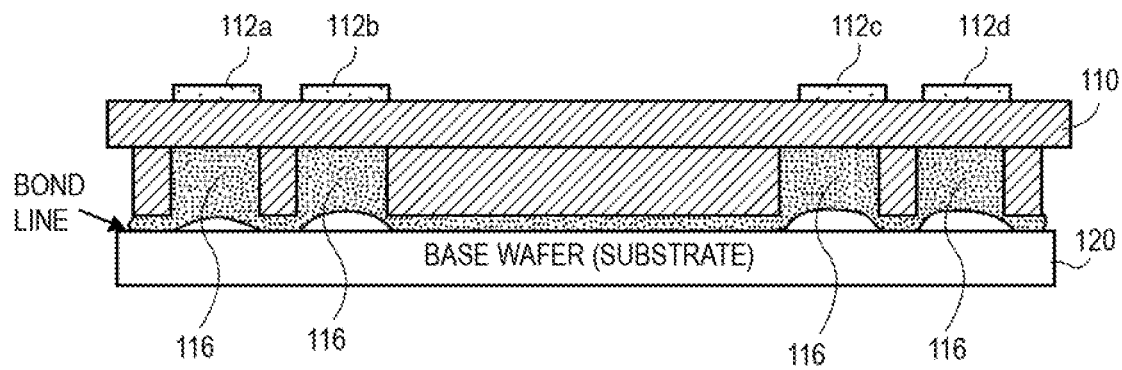
FIG. 5 is a cross-sectional view of a PMUT transducer with a number of transmitting/receiving elements having a damping material in a rear cavity of each transmitting/receiving element in accordance with an embodiment of the disclosed technology.
Figure 6:
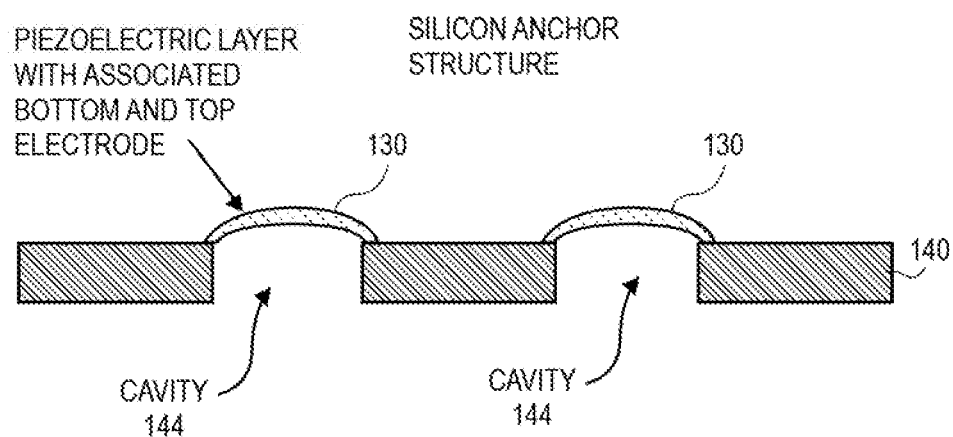
FIG. 6 is a cross-sectional view of a PMUT transducer having domed or non-flat transmitting/receiving elements with a rear cavity in accordance with another embodiment of the disclosed technology.

FIG. 5 shows yet another embodiment of a PMUT transducer in accordance with another embodiment of the disclosed technology. In this embodiment, the transducer includes a silicon membrane layer 110 having a number of PMUT piezoelectric transmitting elements 112a, 112b, 112c, 112d secured to an outer surface thereof. Each of the transmitting elements 112a, 112b, 112c and 112d has an associated cavity 116 located behind the element in the silicon membrane layer. As indicated above, the cavities 116 are filled with a damping material that reduces the ringing of the transmitting elements 112. In the embodiment shown, once the cavities are filled, a substrate layer 120 is secured to the rear surface of the silicon membrane layer 110 to seal the cavities 116.

In one embodiment, the damping material is applied by spraying a material such as benzocyclobutene or a polyimide from a nozzle while a wafer containing the membrane layer is being spun at a rate that ensures a uniform filling of the cavities. The wafer of the membrane layer may be supported by an electrostatic chuck or temporarily secured to a silicon substrate that an act as a sacrificial wafer and that is removed at the end of the process. Once the damping material has cured, the rear surface of the membrane layer can be lapped to smooth out any unevenness in the damping material so that a substrate layer 120 can be bonded or affixed to the rear surface membrane layer 110 in order to seal the rear cavities.

The transmitting PMUT transmitting elements do not need to be flat. In some embodiments, other shapes are possible such as domed-shaped PMUT transmitting elements. FIGS. 6-10 show an embodiment of the disclosed technology where the PMUT transmitting elements are dome-shaped as disclosed, for example, in U.S. Pat. No. 9,437,802, which is herein incorporated by reference in its entirety. In this embodiment, the domed-shaped PMUT transmitting elements 130 are formed on a membrane layer 140. Behind each PMUT transmitting element 130 is a cavity 144 formed in the membrane layer 140. In some embodiments, the cavities 144 may be cylindrical with a diameter that is slightly less than the diameter of the PMUT transmitting elements 130 so that the transmitting elements fit over the diameter of the cavities.

Figure 7:
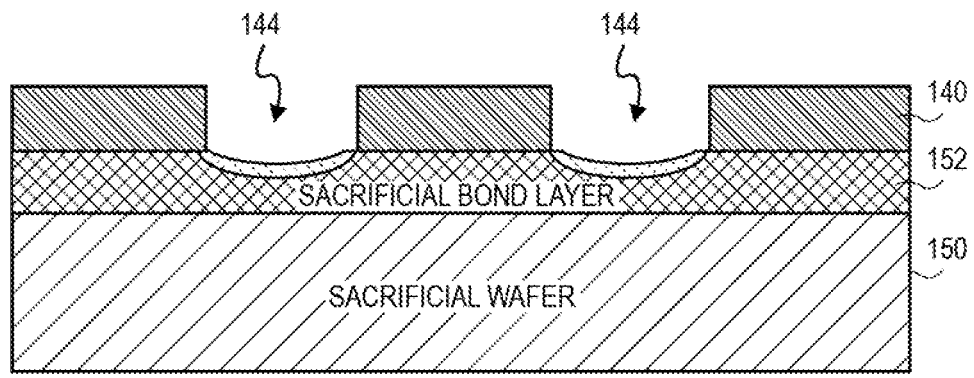
FIG. 7 shows a front surface of a PMUT transducer with domed transmitting/receiving elements that is secured to a sacrificial wafer for processing in accordance with an embodiment of the disclosed technology.

In one embodiment, to fully or partially fill the cavities 144 with a damping material, the membrane layer 140 is first bonded to a sacrificial wafer 150 with a bond layer 152 as shown in FIG. 7.

Figure 8:
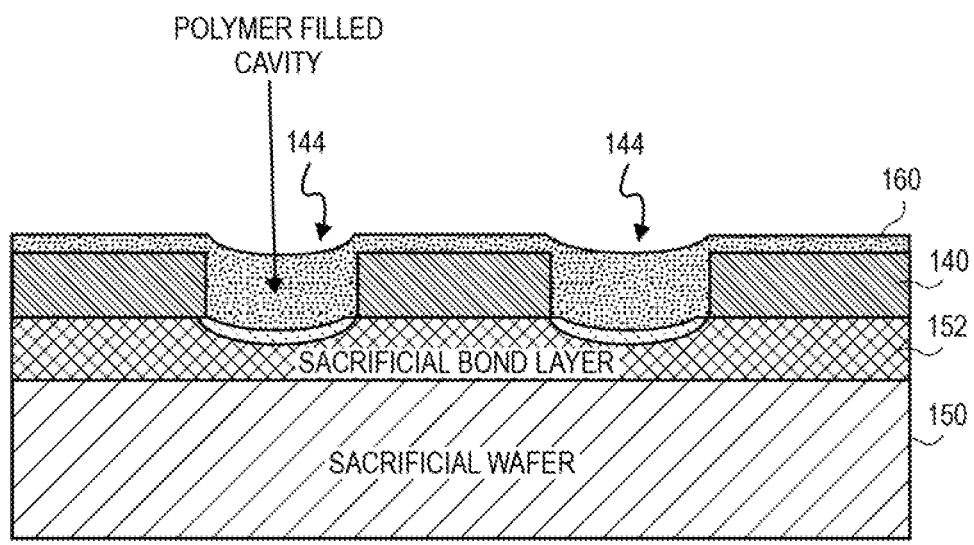
FIG. 8 shows a damping material applied to cavities behind a number of domed transmitting/receiving elements in a PMUT transducer in accordance with an embodiment of the disclosed technology.

As shown in FIG. 8, the cavities 144 are filled with damping material 160 such as a BCB, a polyimide, a polymer, soft epoxy, Paralyene or the like. In one embodiment, damping material 160 includes a thermosetting or thermoplastic polymer that includes an epoxy. As indicated above, the damping material can be applied by spin coating or other methods that ensure that all areas of the cavity are uniformly filled.

Figure 9:
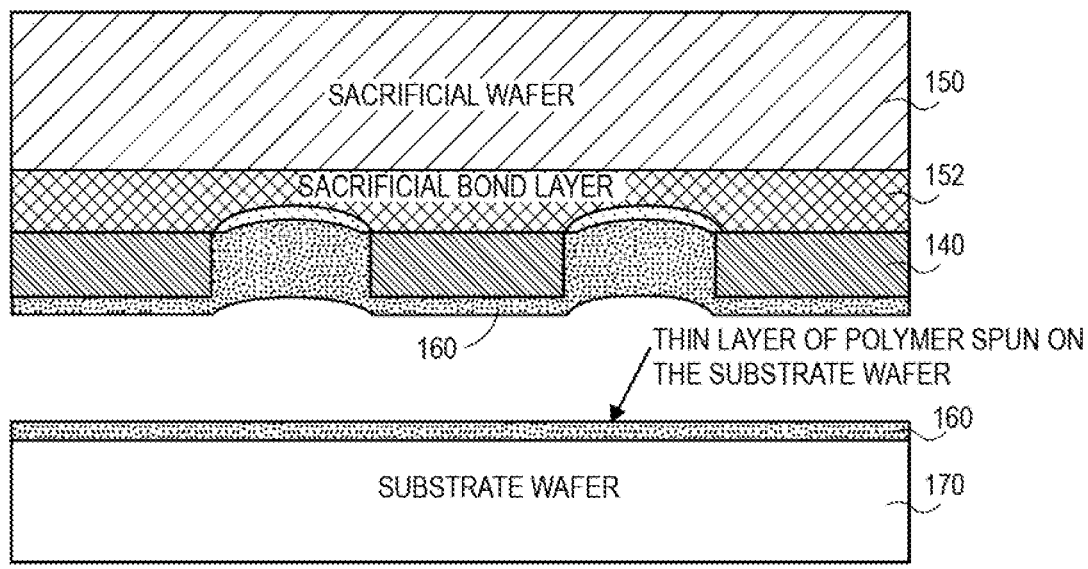
FIG. 9 shows a substrate wafer secured to a PMUT membrane layer with cavities filled with a damping material in accordance with an embodiment of the disclosed technology.

FIG. 9 shows the membrane layer 140 with the cavities filled with the damping material 160. In one embodiment, a substrate layer 170 is secured to the membrane layer 140 with the same material used as the damping material. In the case of a soft epoxy as a damping material, the damping material on the rear surface of the membrane layer 140 can be lapped smooth and a thin layer of the damping material placed on an adjoining surface of the substrate layer 170. The adjoining layers of damping material on the membrane layer and the substrate layer are then pressed together an allowed to cure in order to secure the substrate layer to the membrane layer and to seal the cavities behind the PMUT transmitting elements.

Figure 10:
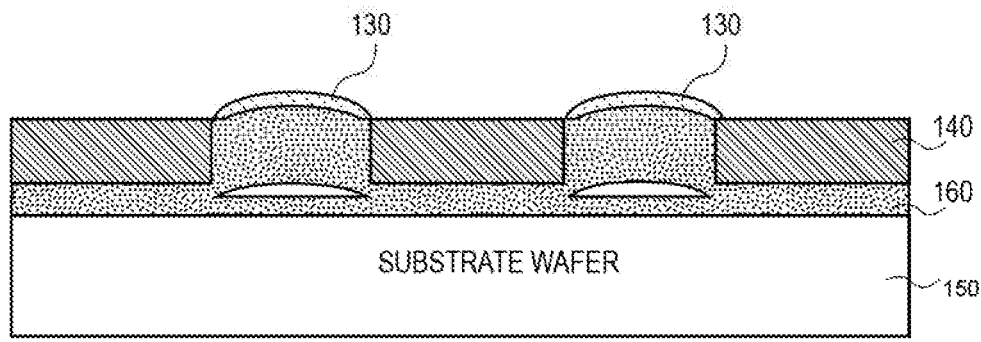
FIG. 10 shows a PMUT transducer having cavities filled with a damping material and the sacrificial layers removed in accordance with an embodiment of the disclosed technology.

As shown in FIG. 10, once the substrate layer 170 is joined to the membrane layer 140, the sacrificial 150 wafer is removed, thereby exposing the upper surface of the dome-shaped PMUT transmitting elements 130.

With all or a portion of the cavity areas filled with a damping material, the bandwidth of the PMUT transmitting elements is increased.

Figure 11:
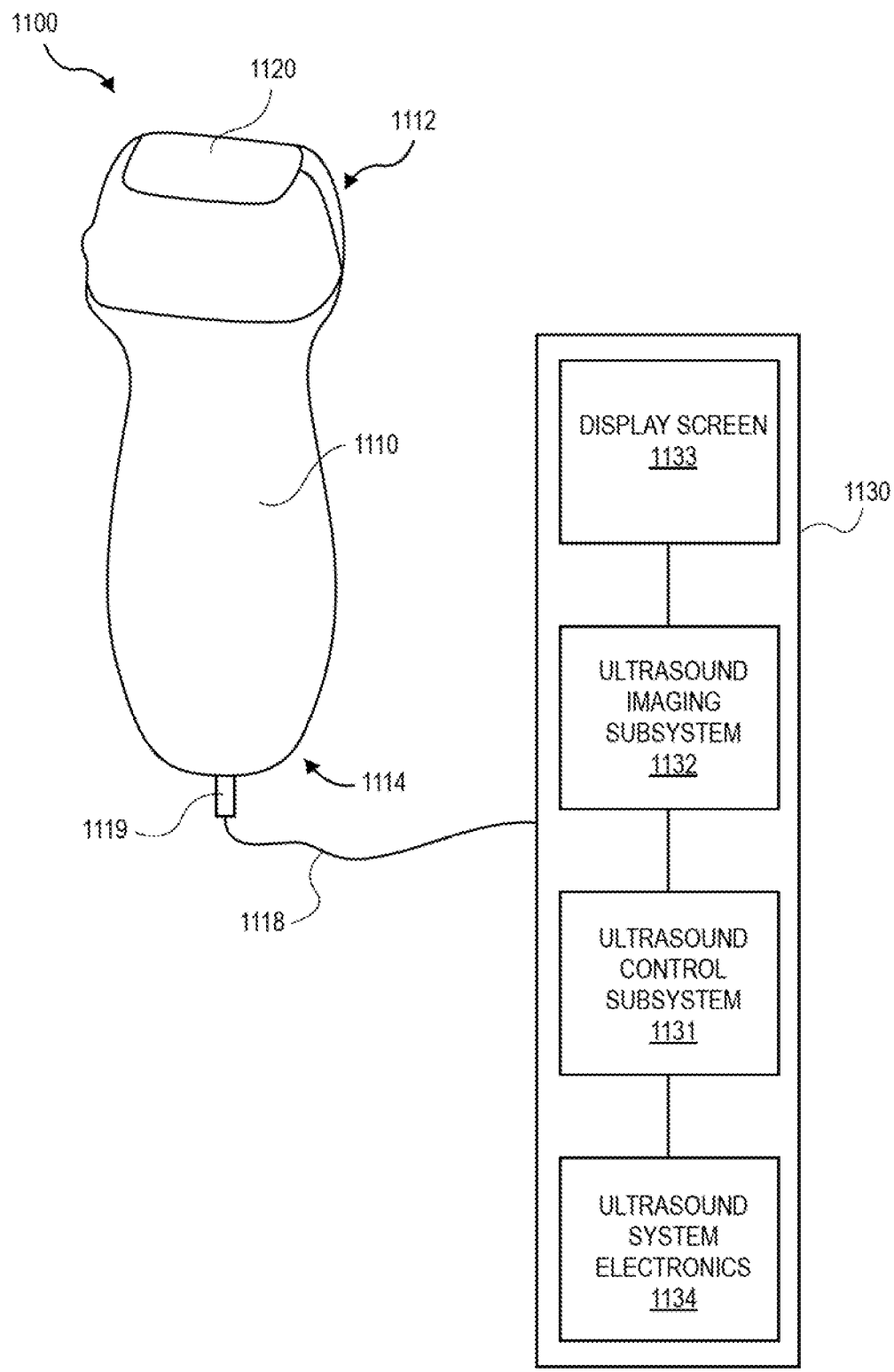
FIG. 11 illustrates a system in accordance with an embodiment of the disclosed technology.

FIG. 11 illustrates a system in accordance with an embodiment of the disclosed technology. The system includes an ultrasound transducer probe 1100 that is electrically coupled to an ultrasound imaging system 1130 via a cable 1118 that is attached to a proximal end 1114 of the probe by a strain relief element 1119 or a wireless link. As shown in FIG. 11, the probe 1100 includes an enclosure 1110 extending between a distal end portion 1112 and proximal end portion 1114. As shown in FIG. 11, the ultrasound transducer probe 1100 includes a transducer assembly 1120 that is electrically coupled to the system electronics. In one embodiment, transducer assembly 1120 has one or more transducer elements with a corresponding cavity that is at least partially filled with a damping material, as described above. In operation, transducer assembly 1120 transmits ultrasound energy from the one or more transducer elements toward a subject and receives ultrasound echoes from the subject. The ultrasound echoes are converted into electrical signals by the one or more transducer elements and electrically transmitted to the system electronics in ultrasound imaging system 1130 to form one or more ultrasound images.

Capturing ultrasound data from a subject using an exemplary transducer assembly (e.g., the transducer assembly 1120) generally includes generating ultrasound, transmitting ultrasound into the subject, and receiving ultrasound reflected by the subject. A wide range of frequencies of ultrasound may be used to capture ultrasound data, such as, for example, low frequency ultrasound (e.g., less than 15 MHz) and/or high frequency ultrasound (e.g., greater than or equal to 15 MHz) can be used. Those of ordinary skill in the art can readily determine which frequency range to use based on factors such as, for example, but not limited to, depth of imaging and/or desired resolution.

In one embodiment, ultrasound imaging system 1130 includes an ultrasound system electronics 1134 that comprises one or more processors, integrated circuits, application specific integrated circuits (ASICs), field programmable gate arrays (FPGAs), and power sources to support the functioning of ultrasound imaging system 1130 in a manner well-known in the art. In one embodiment, ultrasound imaging system 1130 also includes ultrasound control subsystem 1131 having one or more processors. At least one processor causes electrical signals to be sent to the transducer(s) of probe 1100 to emit sound waves and also receives the electrical pulses from the probe that were created from the returning echoes. One or more processors processes the raw data associated with the received electrical pulses and forms an image that is sent to ultrasound imaging subsystem 1132, which displays the image on a display screen 1133. Thus, display screen 1133 displays ultrasound images from the ultrasound data processed by the processor of ultrasound control subsystem 1131.

In one embodiment, the ultrasound imaging system 1130 also has one or more user input devices (e.g., a keyboard, a cursor control device, other user input device) (not shown) that inputs data and allows the taking of measurements from the display of the ultrasound display subsystem, a disk storage device (e.g., hard, floppy, thumb drive, compact disks (CD), digital video discs (DVDs), other storage device) (not shown) for storing the acquired images, and a printer (not shown) that prints the image from the displayed data.

In one embodiment, the ultrasound transducer assembly comprises a transducer membrane layer with a number of PMUT transmitting elements thereon; and a cavity that is behind each transducer element in the membrane layer; wherein each of the cavities is at least partially filled with a damping material.

From the foregoing, it will be appreciated that specific embodiments of the invention have been described herein for purposes of illustration, but that various modifications may be made without deviating from the spirit and scope of the invention.

A PMUT transducer constructed in accordance with the disclosed technology is useful for examining both human and animal subjects or can be used to image other non-living areas of interest. Accordingly, the invention is not limited except as by the appended claims.

In the foregoing specification, specific exemplary embodiments have been described. It will be evident that various modifications may be made to those embodiments without departing from the broader spirit and scope set forth in the following claims. The specification and drawings are, accordingly, to be regarded in an illustrative sense rather than a restrictive sense.

What is claimed is:

1. A piezoelectric micromachined ultrasound transducer apparatus, comprising:
   a transducer membrane layer having a first side and a second side opposite to the first side;
   one or more piezoelectric micromachined ultrasonic transducer elements on the first side of the transducer membrane layer, wherein each of the one or more piezoelectric micromachined ultrasonic transducer elements has
   a cavity on the second side of the membrane layer; wherein the cavity is at least partially filled with a damping material, wherein the cavity is fluidly connected to a pair of passages that are configured to apply a vacuum to the cavity and to supply the damping material to the cavity.

2. The PMUT transducer apparatus of claim 1, further comprising a substrate layer that is secured to the membrane layer that seals the cavity.

3. The piezoelectric micromachined ultrasound transducer apparatus of claim 1, wherein the damping material is a polymer material.

4. The piezoelectric micromachined ultrasound transducer apparatus of claim 1, wherein the damping material is a polymer that condenses or precipitates out of a gaseous phase when cured.

5. The PMUT transducer of claim 1, wherein the passages are formed in one of the membrane layer or in a substrate layer that is secured to the membrane layer that seals the cavity.

6. A method to fabricate a piezoelectric micromachined ultrasound transducer apparatus comprising:
   filling a cavity in a transducer membrane layer with a damping material, the transducer membrane layer having a first side and a second side opposite to the first side, wherein one or more piezoelectric micromachined ultrasonic transducer elements are on the first side of transducer membrane layer, wherein each of the one or more piezoelectric micromachined ultrasonic transducer elements has the cavity on the second side of the transducer membrane layer; and
   forming a channel layer that couples the cavity to an edge of a wafer, wherein the cavity is filled with the damping material through the channel layer.

7. A method to fabricate a piezoelectric micromachined ultrasounds transducer apparatus comprising:
   filling a cavity in a transducer membrane layer with a damping material, the transducer membrane layer having a first side and a second side opposite to the first side, wherein one or more piezoelectric micromachines ultrasonic transducer elements are on the first side of transducer membrane layer, wherein each of the one or more piezoelectric micromachined ultrasonic transducer elements has the cavity on the second side of the transducer membrane layer, wherein the cavity is filled by the damping material using a spin coating.

8. A method to fabricate a piezoelectric micromachined ultrasound transducer apparatus comprising:
   filling a cavity in a transducer membrane layer with a damping material, the transducer membrane layer having a first side and a second side opposite to the first side, wherein one or more piezoelectric micromachined ultrasonic transducer elements are on the first side of transducer membrane layer, wherein each of the one or more piezoelectric micromachined layer, wherein the cavity is filled by the damping material before a substrate layer is bonded to the transducer membrane layer.

9. A method to fabricate a piezoelectric micromachined ultrasound transducer apparatus comprising:
   filling a cavity in a transducer membrane layer with a damping material, the transducer membrane layer having a first side and a second side opposite to the first side, wherein one or more piezoelectric micromachined ultrasonic transducer elements are on the first side of transducer membrane layer, wherein each of the one or more piezoelectric micromachined layer, wherein a substrate layer is bonded to the transducer membrane layer, and wherein the cavity is filled by the damping material through openings in the substrate layer.

10. The method of claim 9, wherein the cavity is filled by the damping material in a gas phase that condenses onto the walls of the cavity when cured.

11. A method to fabricate a piezoelectric micromachined ultrasound transducer apparatus comprising:
   filling a cavity in a transducer membrane layer with a damping material, the transducer membrane layer having a first side and a second side opposite to the first side, wherein one or more piezoelectric micromachined ultrasonic transducer elements are on the first side of transducer membrane layer, wherein each of the one or more piezoelectric micromachined layer,
   bonding the transducer membrane layer at the first side to a first substrate using a first bond layer to fill the cavity with the damping material; and
   bonding the transducer membrane layer at the second side to a second wafer using a second bond layer after filling the cavity with the damping material; and
   removing the first substrate.

12. A method for a piezoelectric micromachined ultrasound transducer apparatus, comprising:
   driving one or more piezoelectric micromachined ultrasonic transducer elements with an electrical driving signal;
   receiving acoustic signals by the one or more piezoelectric micromachined ultrasonic transducer elements; and
   generating an electrical response signal in response to the received acoustic signals by the one or more piezoelectric micromachined ultrasonic transducer elements, wherein the piezoelectric micromachined ultrasound transducer apparatus comprises a transducer membrane layer having a first side and a second side opposite to the first side; the one or more piezoelectric micromachined ultrasonic transducer elements on the first side of the transducer membrane layer, wherein each of the one or more piezoelectric micromachined ultrasonic transducer elements has a cavity on the second side of the membrane layer, and wherein the cavity is at least partially filled with a damping material, wherein the cavity is fluidly connected to a pair of passages that are configured to apply a vacuum to the cavity and to supply the damping material to the cavity.

13. The method of claim 12, wherein the piezoelectric micromachined ultrasound transducer apparatus further comprises a substrate layer that is secured to the membrane layer that seals the cavity.

14. The method of claim 12, wherein the damping material is a polymer material.

15. The method of claim 12, wherein the damping material is a polymer that precipitates out of a gaseous phase when cured.

* * * * *